United States Patent
Grasshoff et al.

(10) Patent No.: US 7,830,577 B2
(45) Date of Patent: Nov. 9, 2010

(54) MICROMECHANICAL DEVICE WITH ADJUSTABLE RESONANT FREQUENCY BY GEOMETRY ALTERATION AND METHOD FOR OPERATING SAME

(75) Inventors: Thomas Grasshoff, Dresden (DE); Thomas Klose, Dresden (DE); Thilo Sandner, Dresden (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 394 days.

(21) Appl. No.: 11/968,743

(22) Filed: Jan. 3, 2008

(65) Prior Publication Data
US 2008/0165403 A1 Jul. 10, 2008

(30) Foreign Application Priority Data
Jan. 10, 2007 (DE) .................... 10 2007 001 516

(51) Int. Cl.
*G02B 26/00* (2006.01)
(52) U.S. Cl. .................... 359/224.1; 359/221.2
(58) Field of Classification Search .............. 359/199.2, 359/199.3, 199.4, 200.6, 200.7, 200.8, 212.1, 359/221.2, 223.1, 224.1
See application file for complete search history.

(56) References Cited

U.S. PATENT DOCUMENTS

| 5,275,047 | A | 1/1994 | Zabler et al. |
| 5,438,870 | A | 8/1995 | Zabler et al. |
| 6,256,131 | B1 | 7/2001 | Wine et al. |
| 6,285,489 | B1 | 9/2001 | Helsel et al. |
| 6,331,909 | B1 | 12/2001 | Dunfield |
| 7,242,511 | B2 * | 7/2007 | Ko et al. .................... 359/291 |
| 2006/0071578 | A1 | 4/2006 | Drabe et al. |
| 2007/0115529 | A1 * | 5/2007 | Dewa .................... 359/214 |

FOREIGN PATENT DOCUMENTS

| DE | 44 24 635 A1 | 1/1996 |
| DE | 197 09 913 A1 | 10/1998 |
| DE | 10 2004 045 528 A1 | 3/2006 |
| WO | 2004/092745 A1 | 10/2004 |

OTHER PUBLICATIONS

Official communication issued in counterpart Chinese Application, mailed on Jun. 26, 2009.

* cited by examiner

*Primary Examiner*—Frank G Font
(74) *Attorney, Agent, or Firm*—Keating & Bennett, LLP

(57) ABSTRACT

A micromechanical device described has an oscillation system with an oscillation body and an elastic suspension, by which the oscillation body is oscillatorily suspended. The elastic suspension has at least two spring beams. An adjuster for adjusting a resonant frequency of the oscillation system by changing the position of the at least two spring beams of the elastic suspension towards each other is provided.

15 Claims, 4 Drawing Sheets

MICROMECHANICAL DEVICE WITH ADJUSTABLE RESONANT FREQUENCY BY GEOMETRY ALTERATION AND METHOD FOR OPERATING SAME

CROSS-REFERENCE TO RELATED APPLICATIONS

This application claims priority from German Patent Application No. 102007001516.1, which was filed on Jan. 10, 2007, and is incorporated herein in its entirety by reference.

TECHNICAL FIELD

The present invention relates to a micromechanical device with adjustable resonant frequency by geometry alteration which is suitable, for example, in connection with resonant micro scanner mirrors, and a method for operating same.

BACKGROUND

Micromechanical devices with oscillation systems are used both as micromechanical sensors and micromechanical actuators. The oscillation system consisting of an oscillation body and an elastic suspension exhibits a natural or resonant frequency. In many applications, the resonant frequency of the oscillation system must be in accordance with a fixedly predetermined frequency so as to achieve, utilizing the resonance enhancement, sufficient sensitivity such as in the case of a sensor, and a sufficient oscillation amplitude such as in the case of an actuator. Examples of such micromechanical devices with an oscillation system are clock generators in clocks or deflecting mirror such as scanner mirrors used for data protection. In the last-mentioned scanner mirrors, for example, the data frequency or modulation frequency and the oscillation frequency must be in a fixedly predetermined ratio to each other. A further example for an application, where a nominal frequency is given, is present when a pair of a sensor or actuator that are basically identical in construction are to be synchronized to each other.

In order to keep the power to be consumed for the oscillation generation low, oscillation systems of such devices are generally of a relatively high Q, with the result that the resonance curve is narrow and that, if the desired oscillation amplitude is adhered to, there will be very little tolerance in the excitation frequency.

The reasons for a deviation of the resonant frequency of the oscillation system of a micromechanical device from a nominal resonant frequency are extremely manifold and may coarsely be divided into two groups, namely such leading to a constant resonant frequency deviation or resonant frequency offset in spite of identical and constant environmental conditions and caused, for example, by production or fabrication variations/tolerances, and such that are subject to temporal changes or caused, for example, by variations in the environmental conditions. In the following, for the constant, for example, fabrication related deviation of the actual resonant frequency of a micromechanical device from its nominal resonant frequency, the term "resonant-frequency deviation" will be used, whereas for the frequency deviations subject to temporal changes during operation or lifetime, the term "resonant-frequency variation" will be used.

The term "resonant-frequency deviation" therefore also includes the mismatch in the resonant frequency of devices that are basically identical in construction, which occurs in spite of identical and constant environmental conditions. The reason for this lies in variations of frequency-determining material parameters such as elastic constants, density, etc., and statistical or systematical deviations in the dimensions of spring and mass or gaps having a dampening effect due to tolerances relating to adjustment, structuring and layer generation in the fabrication of the micromechanical devices.

The term resonant-frequency variation, in contrast, is meant to describe the variation of the resonant frequency of the oscillation system of a micromechanical device caused by, for example, variations in the environmental conditions such as variations in pressure or temperature. However, resonant-frequency variations may also be the result of different degrees of absorption of different gas molecules, humidity and the like on the oscillation system or of temporal changes of the material parameters.

The known measures for adjusting the resonant frequency of the oscillation system of a micromechanical device to a nominal resonant frequency may also be divided into two strategy types, namely a strategy, according to which in quasi one of the last fabrication steps, non-reversible changes are performed on the micromechanical devices for matching the resonant frequency of the oscillation system, and a strategy, according to which the resonant frequency of the oscillation system is corrected to the nominal resonant frequency during operation, such as readjusted via a control loop. The first strategy is, of course, suitable for the compensation of permanent resonant-frequency deviations only and in some applications necessitating compensation of the resonant-frequency variations as well cannot substitute a resonant-frequency correction during operation.

There are several approaches for regulating the resonant frequency during operation. U.S. Pat. No. 6,331,909 and U.S. Pat. No. 6,285,489 describe a resonant-frequency regulation where, for altering the resonant frequency, the ambient pressure is varied, whereby the effective mass of the element moved or the oscillation body changes due to the gas loading, whereby the resonant frequency of the spring-mass system also changes. The necessitated apparatus and control circuit are, however, relatively complex. Furthermore, an embodiment is described, wherein the spring of the spring-mass system is loaded with a gas-absorbing material that, during absorption, changes the material properties and therefore the frequency. Here, too, the disadvantage is the relatively high complexity. Moreover, one may assume that, as a result of the limitations in the choice of the materials of the gas-absorbing type as such available for the spring, the Q of the system will be degraded and may not be optimal.

In U.S. Pat. No. 6,256,131 and U.S. Pat. No. 6,285,489, a torsion oscillation system is described, wherein a portion of the rotating mass may be shifted away from the torsion axis or towards the torsion axis, respectively, by means of electrostatic forces. This changes the moment of inertia and, in turn, the resonant frequency. Although this procedure allows regulating the resonant frequency, larger-scale deviations cannot be corrected due to the generally small translation paths of the movable mass. Additional electrical lines as a result of the elastic suspension or torsion springs or on the torsion springs make this embodiment complex, resulting in increased spatial requirements on the mirror plate. This also increases the dynamic deformation.

In another embodiment, a micromechanical device with a matchable resonant frequency is described according to EP 1613969 A1. With the help of geometrical structures, such as ribs, which may systematically be broken by external influences, the effective length and therefore the rigidity of micromechanical spring elements is influenced in an irreversible and discrete manner. During operation, a virtual spring-constant increase or reduction may be achieved by applying a voltage difference between the oscillation body and suitably arranged stationary electrodes.

SUMMARY

According to an embodiment, a micromechanical device may have: an oscillation system having an oscillation body; an elastic suspension, by means of which the oscillating body is oscillatorily suspended, wherein the elastic suspension has at least two spring beams; an adjuster for adjusting the resonant frequency of the oscillation system by changing the position of the at least two spring beams of the elastic suspension to each other.

According to another embodiment, a light-deflecting apparatus may have: a micromechanical device having: an oscillation system having an oscillation body; an elastic suspension, by means of which the oscillating body is oscillatorily suspended, wherein the elastic suspension has at least two spring beams; an adjuster for adjusting the resonant frequency of the oscillation system by changing the position of the at least two spring beams of the elastic suspension to each other, wherein the oscillation body is a deflection mirror; a drive for operating the oscillation system at the resonant frequency.

According to another embodiment, a method for operating a micromechanical device with an oscillation system having an oscillation body and an elastic suspension, by means of which the oscillation body is oscillatorily suspended, wherein the elastic suspension has at least two spring beams, may have the step of: adjusting a resonant frequency of the oscillation system by changing the position of the at least two spring beams of the elastic suspension towards each other.

An inventive micromechanical device comprises an oscillation system comprising an oscillating body and an elastic suspension, by means of which the oscillation body is oscillatorily suspended as well as means for adjusting the resonant frequency of the oscillation system by changing the position of at least two spring beams of the elastic suspension towards each other.

The inventive method for operating a micromechanical device with an oscillation system comprising an oscillation body and elastic suspension, by means of which the oscillating body is oscillatorily suspended, comprises adjusting a resonant frequency of the oscillation system by changing the position of the at least two spring beams of the elastic suspension towards each other.

The present invention is based on the finding that, by changing the respective spring geometry and in particular changing the position of the at least two spring beams towards each other, an alteration of the spring constant of the elastic suspension may be achieved, which in turn provides an alteration oror adjustability and regulation of the oscillation system oror the spring-mass system. Adjustment is possible in continuous or discrete steps. In addition, the additions to be made to the mechanical oscillation system are limited to providing electrical structures as they can be fabricated in an unproblematic and cost-effective manner by means of micromechanical fabrication methods and as they must anyway be provided in an electrostatic excitation of the oscillation system.

In a micromechanical device according to embodiments of the present invention, next to the adjustability of the resonant frequency of the oscillation system by changing the respective spring geometry by means of micromechanical actuators, means for the irreversible and reversible correction of permanent resonant-frequency deviations are also provided. This provides a combined adjusting and regulating capability so that both resonant-frequency deviations and variations may be compensated for. This significantly increases the yield in fabrication as micromechanical devices exhibiting resonant frequency outside the frequency range directly after their fabrication do not have to be rejected but may be manipulated by irreversible and reversible compensations such that their resonant frequency is sufficiently close to the nominal resonant frequency. In addition to that, the present invention allows for the resonant frequency to be adjusted across a suitably large range in sufficiently small steps, for example in a continuous manner, so that the nominal frequency, which in operation is subject to variations, can be regulated.

According to a specific embodiment of the present invention, a micromechanical device comprises an oscillation body suspended via four parallel spring beams, such as torsion springs capable of a tilting motion. Each spring is on one side mounted such that it is movable in a limited range. Depending on fabrication variations oror a resonant-frequency deviation, changes in the spring rigidity are possible by systematic alteration of the respective spring geometry. By the controlled, discrete or continuous shifting of both beam elements of the parallel spring by means of a micromechanical actuator, an alteration of the spring rigidity is achieved.

In one embodiment, a discrete change of the resonant frequency may be realized by step-by-step latching of a movable latching element at the end of the movable spring-beam elements.

Embodiments of the present invention may particularly be used for tuning the natural resonance of resonant micro scanner mirrors by altering the spring geometry, such as a V spring, a parallel spring, by means of any type of actuator, such as electrostatic, thermal, magnetic or piezoelectric. Embodiments of the present invention relate to resonant MEMS scanner mirrors, i.e., to actuators operated in the state of resonance enhancement so as to obtain large oscillation amplitudes at low power consumption. As the resulting Q is comparatively high and the resonance curve is therefore narrow, there is very little tolerance in the excitation frequency if the desired oscillation amplitude is maintained.

Embodiments of the present invention concern a combined adjustment and tuning of the resonant frequency so that larger-scale deviations and variations of the resonant frequency may also be compensated for so as to, therefore, enlarge the application field of the scanner mirror. Here, a critical application is data protection, where the data frequency and the oscillation frequency of the mirror must have a fixedly predetermined ratio to each other. A frequency is also given when two sensors/actuators basically identical in construction or two scanner mirrors oscillating in a fixed ratio must be synchronized to each other. An example for this is a two-dimensional scanner that enables reading two-dimensional barcodes via diagonal progressive scanning. Such an application on the one hand necessitates a fixed frequency ratio so as to define a predetermined, fixed Lissajous figure. On the other hand, the frequencies in the two oscillating directions are to differ by a few Hertz only. This necessitated frequency difference, however, lies within the frequency spread given by the technology. What is crucial for the success of such a principle is, therefore, not the exact adjustment of the frequencies in the two oscillation directions but achieving the ratio defined by these frequencies. This, however, strongly depends on deviations and variations of the resonant frequency. Such resonant-frequency deviations and resonant-frequency variations may be compensated by adjusting the resonant frequency of one axis or both axes, wherein, here, adjustment means both non-reversible change, i.e., the frequency change cannot be reversed, and reversible change or matching of the resonant frequency. Resonant-frequency variations cannot be corrected by such adjustments but should be compensated instantaneously, i.e., in operation, and reversibly in each case, i.e., advantageously via a control loop.

Embodiments of the present invention therefore relate to a light-deflection apparatus comprising a micromechanical device having a correspondingly adjustable resonant frequency and drive means for operating the oscillation system of the micromechanical device at the resonant frequency. Furthermore, embodiments of the invention comprise control means such as a control loop so as to adjust the resonant frequency of the oscillation system to a nominal resonant frequency. Here, the oscillation amplitude of the oscillation body oror the mirror may, for example, serve as the controlled variable.

BRIEF DESCRIPTION OF THE DRAWINGS

Embodiments of the present invention will be detailed subsequently referring to the appended drawings, in which.

DETAILED DESCRIPTION

Figure 1:
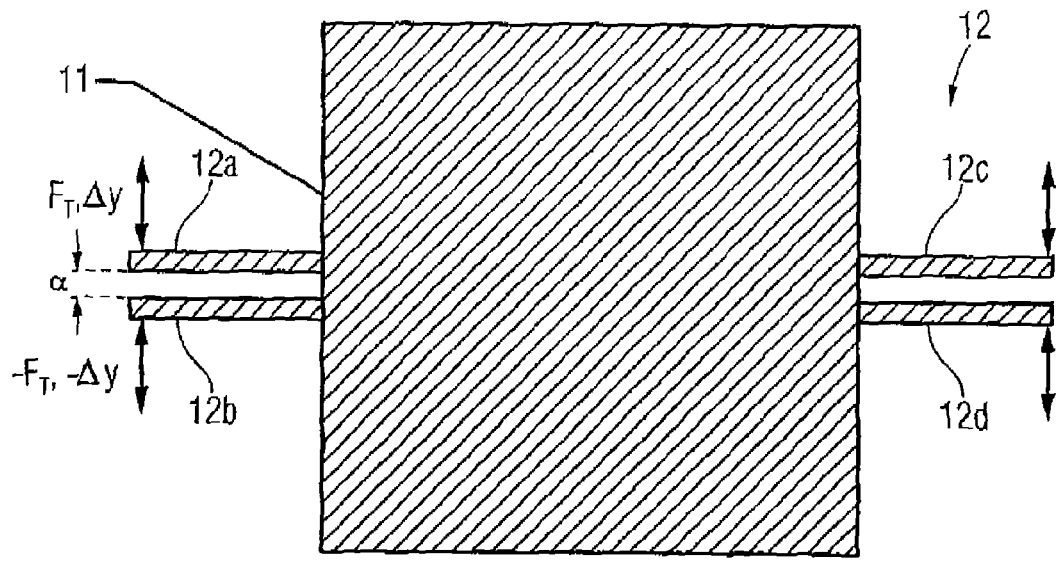
FIG. 1 is a representation of the oscillation system of a micromechanical device, for example of a resonant scanner mirror, according to an embodiment of the present invention.

Before the present invention is explained in greater detail in the following with respect to the accompanying drawings, it is to be noted that the drawings are not to scale for better understanding. In addition, in the figures, like elements are provided with like reference numerals, wherein a repeated description of these elements is omitted.

FIG. 1 shows a simplified representation of a resonant micromechanical device with a variable parallel-spring geometry. The micromechanical device of the present embodiment illustrates a micromechanical mirror as it is used, for example, in microscanners to deflect a modulated light beam with a predetermined nominal frequency so as to move the light beam to and fro in an image field with the nominal frequency, whereby an image is generated on the image field by the modulated light beam moving on the image field. It is to be noted that the present invention may also be used with other micromechanical devices having an oscillation system.

The micromechanical device comprises an oscillation system consisting of an oscillation body 11 serving as a mirror plate and an elastic suspension 12 or 12a, 12b, 12c and 12d. Both the oscillation body 11 and the elastic suspension 12 may, for example, be formed in a semiconductor layer. The suspension 12 consists of four flat and elongated torsion springs 12a, 12b, 12c and 12d, which at one end are each mounted such that they are movable in a limited range and at the other end are each attached to an opposing elongated side of the rectangular oscillation body 11 serving as a mirror. The entire construction could, for example, be carried by a substrate as it is described for known oscillation systems in EP 1613969 A1.

The micromechanical device shown in FIG. 1 as such provides an adjustability of the resonant frequency of the oscillation system consisting of the oscillation body 11 and the elastic suspension 12, either in a discrete or continuous manner, so as to compensate for the permanent fabrication-related resonant-frequency deviations or the like from the nominal resonant frequency described in the introduction to this description, wherein this adjustability will be discussed in greater detail in the following. The adjustment of the resonant frequency is enabled via the spring rigidity of the spring-mass system, for example, of the oscillation system consisting of the oscillation body 11 and the elastic suspension 12. Here, the square of the natural frequency of a linear oscillator is directly proportional to the spring rigidity:

$$f^2 \sim k$$

An alteration of the spring rigidity is achieved by systematically changing the respective spring geometry. A controlled discrete or continuous outwards shifting of both beam elements of the parallel spring increases the effective distance of the spring beams and, therefore, the bending proportion of the spring rigidity. This increases the total rigidity of the scanner mirror. Vice versa, shifting the spring beams inwards decreases the total rigidity based on the reduced bending proportion. The total rigidity is comprised of a torsion proportion $k_T$ and a bending proportion $k_B$:

$$k_G = 2 \cdot (k_T + k_B)$$

Here, the bending proportion is directly proportional to the square of the distance a or to the alteration of the distance Δa of the parallel bending beams, respectively:

$$k_B \sim \Delta a^2$$

when mechanical latching is possible, whereby an alteration of a is suppressed by means of the restoring force resulting from the twisting of the mirror spring.

Taking into consideration that the distance alteration Δa is proportional to a tuning force $F_T$, and assuming that the distance a is not kept constant by mechanical latching in twisting the torsion spring, the bending proportion is made directly proportional to the square of the tuning force causing the distance alteration:

$$k_B \sim F_T^2$$

Here, the tuning force $F_T$ is the force necessitated for changing the spring geometry or for causing the positive or negative distance alteration Δa, respectively. For the generation of this tuning force, conventional actuators to be used in microsystems may be utilized. I.e., electrostatic, piezoelectric or electrothermal actuatorprinciples are possible.

Here, electrostatic drives based on the alteration of the electric field strength in dependence on the path may be realized either according to the principle of a plate capacitor with a movement in the direction of the electric field line, or according to the principle of a finger capacitor with a movement perpendicular to the electric field lines.

In electrothermal actuators, e.g. embodiments according to the principle of an unsymmetrical expansion of individual layers in multi-layer systems (bending converters) due to different coefficients of thermal expansion are possible. These may be found on the oscillation-body plane or the mirror plane, respectively, or in a position perpendicular to the oscillation-body plane.

Piezoelectric drives utilizing the reciprocal piezo effect so as to generate unsymmetrical expansions may also be employed as bending converters. They may, however, be employed only in a manner perpendicular to the oscillation-body plane or mirror plane, respectively, which may be changed by a suitable conversion of the force effect generated in the plate plane.

In dependence on the amount of force generated by means of the respective actuator and the change of position of the spring beams towards each other caused thereby, the total rigidity of the oscillation system may be altered so that thereby the resonant frequency may be regulated.

In executing the above principle for changing the resonant frequency, three scenarios are generally possible.

In a first scenario, a step-by-step adjustment (irreversible or reversible) of the resonant frequency is effected by a step-by-step alteration of the distance between the spring beams by means of mechanical latching of the shiftable spring beams and the respective tuning force necessitated. In this scenario, the frequency may be adjusted, but not, however, regulated.

In a second scenario, a constant actuator force is applied to the shiftable spring elements, whereby the bending proportion $k_b$ is made dependent on the mechanical deflection angle. This enables an alteration of the spring characteristic, whereby a linear, degressive or progressive spring characteristic curve may be enforced.

In a third scenario, the resonant frequency is regulated by changing the total rigidity as a function of the actuator force. Here, the desired resonant frequency, i.e. the associated total rigidity, may be readjusted.

Figure 2:
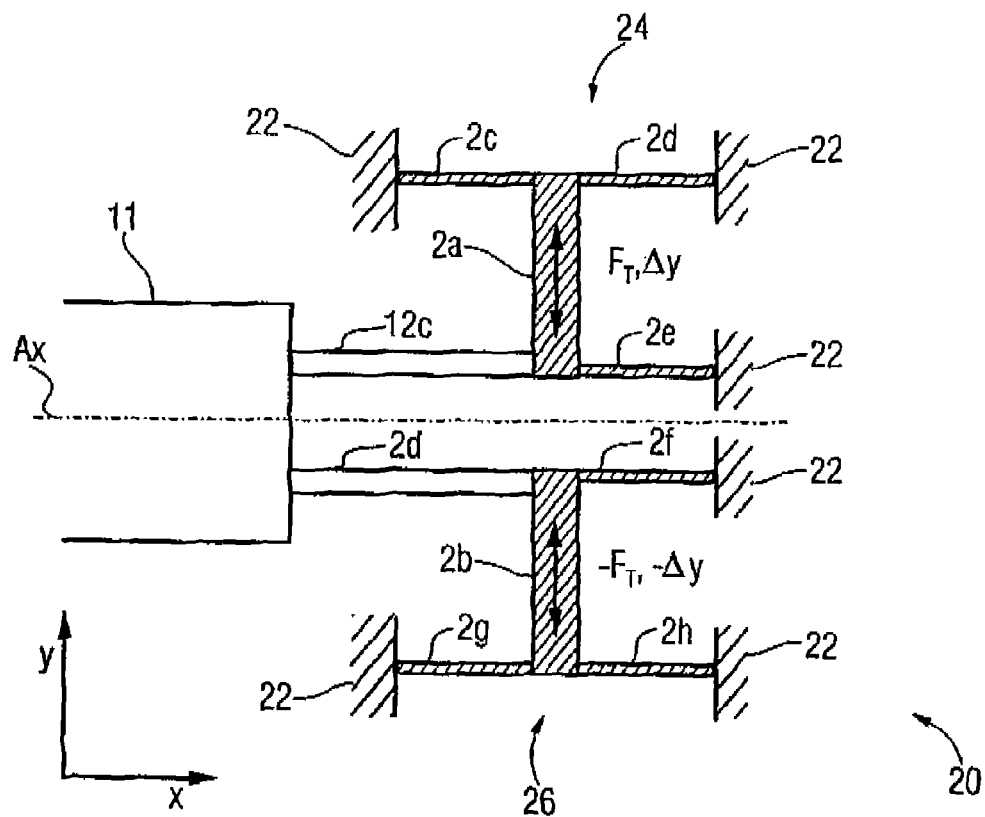
FIG. 2 is a representation of the suspension of a micromechanical device, for example of a resonant scanner mirror having two parallel spring beams oror torsion springs suitable for tuning through geometry alteration, according to an embodiment of the present invention.

FIG. 2 shows an embodiment of a movable spring-beam suspension generally designated with 20. As shown in FIG. 2, the two parallel spring beams or torsion springs 12c and 12d are at one end attached to the oscillation body 11 and, at the other end, movably mounted to a support structure 22 via elastic suspensions 24 and 26. The elastic suspensions 24 and 26 are constructed symmetrically relative to an axis Ax representing a pivot axis of the oscillation body and each include one beam 2a and 2b as well as flexible ribs 2c, 2d and 2e or 2f, 2g and 2h, respectively. A first end of the beam 2a is on one side connected to the spring beam 12c and on the other side thereof connected to the flexible rib 2e. The other end of the flexible rib 2e is connected to the support structure 22. A second, opposing end of the beam 2a is on both sides thereof connected to opposing portions of the support structure 22 via the flexible ribs 2c and 2d. The structure of the elastic suspension 26 corresponds thereto, so that a separate description thereof is not necessary.

During operation, suitable drive means may apply an actuating force, which was designated above as a tuning force $F_T$, to the beams 2a and 2b so that a deflection thereof and therefore an alteration of the location at which the spring beams are mounted to the support structure 22 may be caused. In the embodiment shown, the beams 2a and 2b may be deflected by a distance $\Delta y$ or $-\Delta y$, respectively, by exerting a respective force $F_T$ or $-F_T$, respectively. The ribs 2c to 2h exhibit sufficient flexibility so as to enable such a deflection.

The structures shown in FIG. 2 may, for example, be patterned in a layer of a micromechanical device. Micromechanical actuators (not shown in FIG. 2) may advantageously be integrated into the device or mounted outside the device. Such actuators may be implemented in the embodiment shown in FIG. 2, for example, by providing finger electrodes on the beams 2a and 2b, the longitudinal extensions of which are perpendicular to the longitudinal extensions of the beams 2a. Such finger electrodes may be opposite respective fixed electrodes so that a respective deflection may be caused by applying a voltage between the finger electrodes and the fixed electrodes. Such micromechanical drives using interdigital fingers are known in the art and therefore do not necessitate any further explanation.

It is to be noted here that the elastic or soft suspension at a support structure described referring to FIG. 2 may be used for all movable mountings described herein. It is further to be noted that a change of position between two spring beams may also be achieved if only one of the spring beams is movably mounted on the support structure, for example using one of the two elastic suspensions 24 and 26 shown in FIG. 2.

FIGS. 3a to 3d show embodiments of basic spring geometries for the geometry tuning of micromechanical oscillators such as scanner mirrors. The basic spring geometries are characterized by the fact that the spring is on one side attached to the oscillation body, such as the mirror plate 11, and on the other side mounted such that it is movable within a limited range.

Figure 3A:
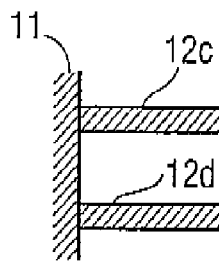
FIGS. 3a to 3d are representations of basic spring geometries for the geometry tuning of micromechanical oscillators, according to an embodiment of the present invention.

FIG. 3a shows the mirror plate 11 having two parallel spring beams 12c and 12d. The directions of movement of the elastic suspension or or spring beams 12c and 12d represented here may basically be effected in a positive or a negative y direction. By applying an actuator force $F_T$ to the shiftable spring beams 12c and 12d, the spring characteristic may be changed. The bending proportion of the spring rigidity $k_B$ is dependent on the mechanical deflection angle. In the embodiment shown, the beams 12a and 12b may be deflected by a distance $\Delta y$ or $-\Delta y$, respectively, by exerting a respective force $F_T$ or $-F_T$, respectively. Linear, degressive or progressive spring characteristic curves could, in the optimal case, be enforced. Adjusting the resonant frequency to a nominal frequency is possible by changing the total rigidity as a function of the actuator force.

Figure 3B:
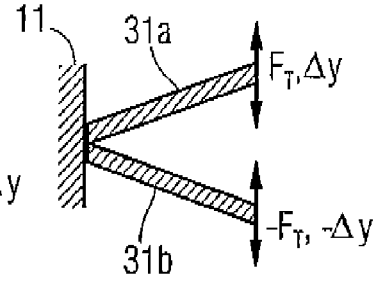
Figure 3C:
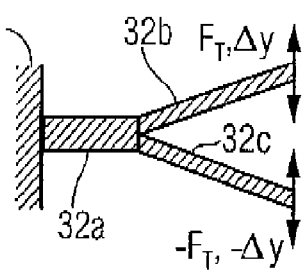
Figure 3D:
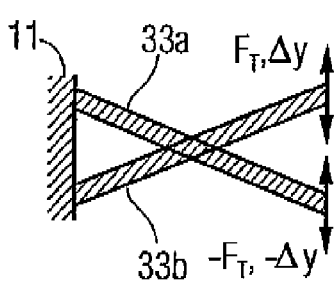

FIG. 3b shows the mirror plate 11 having two spring beams 31a and 31b in a v-shaped embodiment of the spring geometry. FIG. 3c shows the mirror plate 11 having three spring beams 32a, 32b and 32c in a y-shaped embodiment of the spring geometry. FIG. 3d shows the mirror plate 11 having two spring beams 33a and 33b crossing each other so as to realize an x-shaped spring geometry.

In FIGS. 4a to 4d, which relate to respective embodiments of the spring geometry, the basic spring geometries are each supplemented by a fixedly clamped center spring-beam element 40a, 40b, 40c and 40d. The fixedly clamped spring-beam elements are secured to the support structure 22, such as the device frame. This spring-beam element raises the stability of the entire spring and therefore increases the rigidity both with respect to movements in the mirror-plate plane and movements perpendicular to the mirror-plate plane. Hereby, properties of the microscanner mirror, such as mode splitting, shock strength or electrostatic stability, may be improved and optimized. By using two or more fixedly clamped spring beams, the stability may be increased as desired.

Figure 4A:
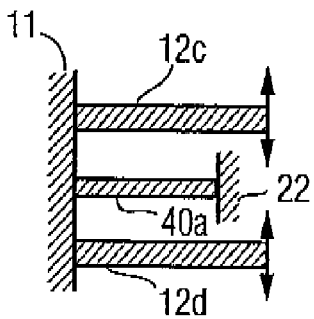
FIGS. 4a to 4d are representations of basic spring geometries having a unilaterally fixedly clamped stabilizing center spring beam, according to a further embodiment of the present invention.
Figure 5A:
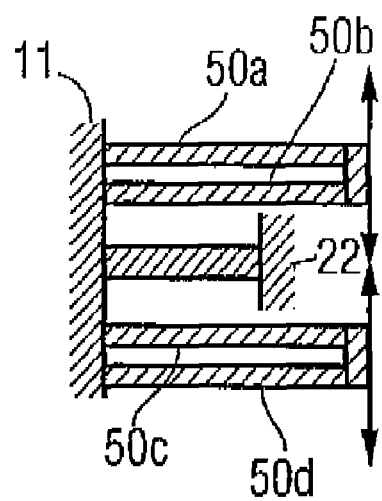
FIGS. 5a to 5d are representations of basic spring geometries having variable parallel spring structures, according to a further embodiment of the present invention.

FIG. 5a shows an embodiment that is different from the embodiment shown in FIG. 4a in that pairs of two parallel spring beams, 50a and 50b or 50c and 50d, respectively, are provided rather than one single spring beam. The parallel spring beams 50a and 50b may be shifted simultaneously in one direction. In the embodiment shown, the beams 50c and 50d may, for example, be deflected simultaneously by a distance Δy by exerting a force $F_T$. Here, the frequency change possible increases per path change Δy, which, however, necessitates increased force $F_T$. This alternative is advantageous as opposed to simply broadening the movable spring beams in that a more favorable bending rigidity of the spring beams in the direction of movement may be achieved as the beam width influences this bending rigidity with the third power.

Figure 4B:
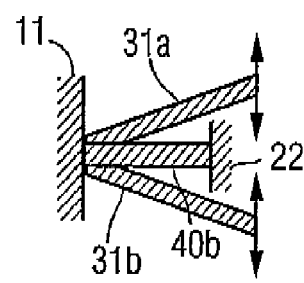
Figure 5B:
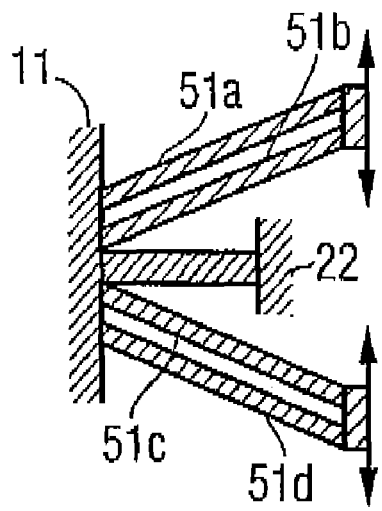

The embodiment shown in FIG. 5b is also different from the embodiment shown in FIG. 4b, in that the movably mounted spring beams 31a and 31b are replaced by spring-beam pairs 51a, 51b and 51c, 51d.

Figures 4C, 4D:
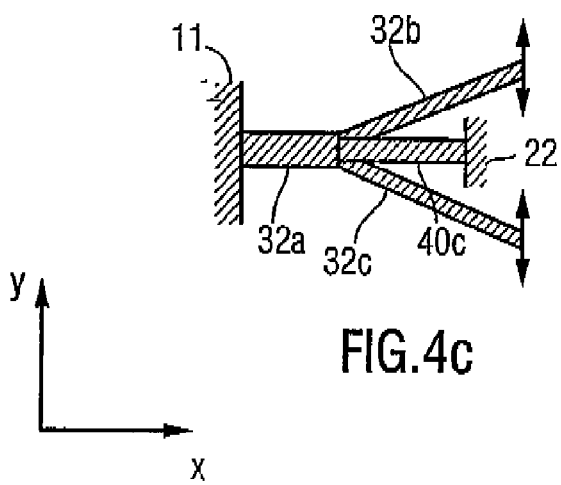
Figure 5C:
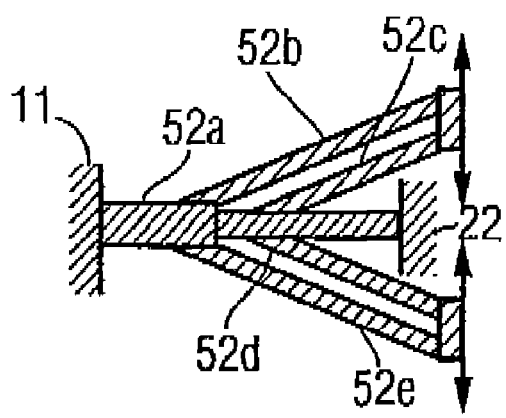
Figure 5D:
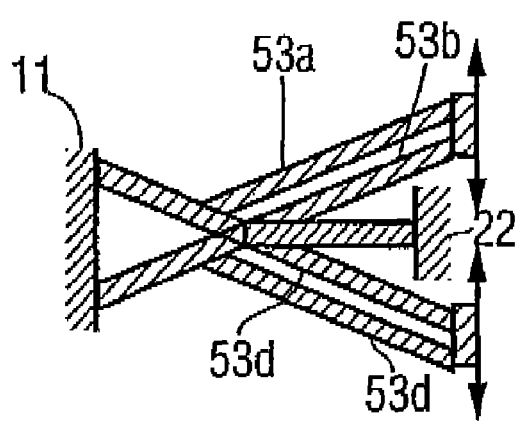

In the embodiments shown in FIGS. 5c and 5d, in contrast to FIGS. 4c and 4d, spring beams, each movably mounted, have double spring beams. Thus, according to FIG. 5c, double spring beams 52b, 52c and 52d, 52e are connected to one spring beam 52a corresponding to the spring beam 32a in FIG. 4c. According to FIG. 5d, as compared to FIG. 4d, portions of the spring beams facing the respective movable mounting, indicated by a respective arrow, are each formed by double spring beams 53a, 53b or 53c, 53d, respectively.

It is obvious that in the embodiments shown in FIGS. 3a to 3d, too, the respective spring beams may be formed by double spring beams. In addition, the positions of the spring beams within one of the pairs may also alternatively oror additionally be changeable relative to each other, for example by mounting the ends of the spring beams of a pair of double spring beams such that they are moveable relative to each other.

The previous embodiments make a continuous and reversible alteration of the resonant frequency possible, so as to compensate for resonant-frequency variations during the operation of the oscillation body 11 of, for example, the scanner mirror plate and therefore readjust same.

Figure 6:
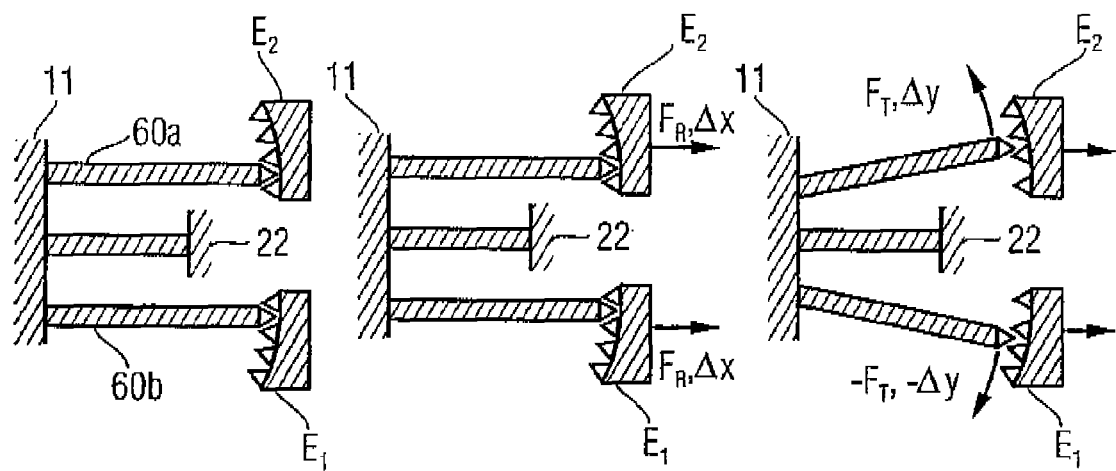
FIG. 6 is a representation of the reversible latching in a parallel-spring geometry for a discrete frequency alteration, according to a further embodiment of the present invention.

FIG. 6 shows an add-on of the example of FIG. 4a, wherein reversible latching is possible. At the ends of the spring beams 60a and 60b, there are latching elements E1 and E2 for latching the spring ends 60a and 60b. These latching elements may, for example, be moved by an additional actuator. First, the latching elements E1 and E2 are shifted by Δx by means of a force $F_R$ so as to be able to realize shifting the movable beam elements 60a and 60b by Δy in a frictionless manner by means of a tuning force $F_T$. Following this, the latching elements E1 and E2 are returned to their original positions in the x direction, whereby the movable beam elements 60a and 60b are latched. The movable latching elements as they are shown in FIG. 6 serve to realize a discrete frequency increase or frequency reduction by means of step-by-step reversible latching.

Figure 7:
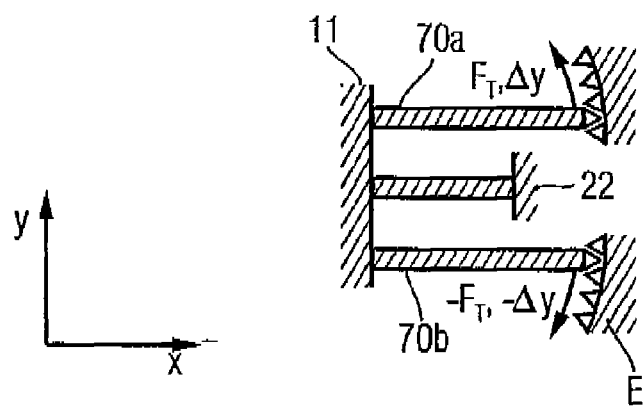
FIG. 7 is a representation of the irreversible latching in a parallel-spring geometry for a discrete frequency alteration, according to a further embodiment of the present invention.

The embodiment shown in FIG. 7 presents a second alternative without a movable latching element E. Here, the friction losses and with them the tuning force necessitated increase. Moreover, this alternative is best executed in an irreversible manner due to the large amount of friction. Although a reversible alternative is viable, the material stresses would be so great that the risk of a destruction of the two spring beams 70a and 70b would be greatly increased.

Thus, resonant-frequency deviations after the fabrication process may be compensated for by means of reversible or irreversible latching via singular or repeated step-by-step changing of the elastic suspension 12 or the spring geometry.

Referring to the embodiments of FIGS. 1 to 7, a micro mirror was described as a potential application of the present invention. It is obvious, however, that the present invention may also be employed in other micromechanical devices with matchable oscillation frequency such as sensors. The invention is particularly advantageous in applications, in which the oscillation system of a micromechanical device is operated in or near its resonant frequency so that the increase of the oscillation amplitude is utilized by the resonance effect.

Therefore, the present invention provides a concept for adjusting the resonant frequency of an oscillation system consisting of an oscillation body and an elastic suspension. Such a system may be termed a resonant oscillator, wherein the force necessitated for changing the geometry increases as the spring rigidity of the resonant oscillator increases due to large frequencies or large oscillation-body dimensions. The present invention allows changing the resonant frequency with a high resolution, wherein the spring rigidity may be modified both with torsion vibrators and with translatory vibrators. In general, the present invention provides integration of variable spring geometries with increasable and decreasable spring rigidities in resonant microsystems such as one-dimensional torsion vibrators (such as one-dimensional micromirrors), two-dimensional torsion vibrators (such as two-dimensional micro mirrors) and translatory vibrators (such as resonant sinking mirrors). The present invention is particularly advantageously employable so as to reduce or compensate resonance deviations of such devices caused, for example, by fabrication variations and to reduce or compensate resonance variations during the operation of the devices. The force necessitated for changing the spring geometry or the positive or negative distance alteration may advantageously be generated by means of conventional micromechanical drive principles, such as an electrostatic, electrothermal or piezoelectric drive. The elastic suspensions may be embodied using variable basic geometries as well as combinations and derivates thereof, for example spring beams arranged in parallel, spring beams arranged in the shape of a v, spring beams arranged in the shape of a y and spring beams arranged in the shape of an x. Variations of these basic geometries may consist in providing an additional center rib fixedly clamped on both sides, two or more additional center ribs or two or more bending ribs fixedly clamped on one side. Furthermore, additional latching elements may be provided at the movable ends of the unilaterally fixedly clamped bending beams having or not having their own micromechanical drives, which may allow reversible and irreversible (in one direction only) latching.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A micromechanical device, comprising:
an oscillation system comprising an oscillation body;
an elastic suspension, by means of which the oscillation body is oscillatorily mounted to a support body, wherein the elastic suspension comprises at least two spring beams;
an adjuster for adjusting a resonant frequency of the oscillation system by changing a position of the at least two spring beams of the elastic suspension with respect to each other,
wherein the adjuster is adapted to change a position of a support-body-sided end of at least one of the at least two spring beams so as to adjust the position of the spring beams with respect to each other.

2. The micromechanical device according to claim 1, wherein the change of position of the at least two spring beams comprises a change of an angle formed by the spring beams.

3. The micromechanical device according to claim 1, wherein the adjuster for adjusting the resonant frequency is adapted to change the position of support-body-sided ends of both of the at least two spring beams.

4. The micromechanical device according to claim 1, wherein the at least two spring beams are arranged in parallel, are arranged in the form of a v, are in the form of a y, or are arranged in the form of an x.

5. The micromechanical device according to claim 1, wherein at least one of the two spring beams comprises a bilaterally fixedly clamped beam.

6. A micromechanical device, comprising:
an oscillation system comprising an oscillation body;
an elastic suspension, by means of which the oscillation body is oscillatorily mounted to a support body, wherein the elastic suspension comprises at least two spring beams;
an adjuster for adjusting a resonant frequency of the oscillation system by changing a position of the at least two spring beams of the elastic suspension with respect to each other,
wherein the elastic suspension comprises latching elements into which one end of at least one of the at least two spring beams, which is movably mounted to the support body, may be reversibly or irreversibly latched.

7. The micromechanical device according to claim 1, wherein the adjuster for adjusting the resonant frequency comprises a thermal drive apparatus, an electromagnetic drive apparatus or a piezoelectric drive apparatus.

8. The micromechanical device according to claim 7, wherein the micromechanical drive comprises an electrostatic drive apparatus, and electro-thermal drive apparatus, an electromagnetic drive apparatus or a piezoelectric drive apparatus.

9. The micromechanical device according to claim 1, wherein the oscillation body is formed as a one-dimensional torsion vibrator, a two-dimensional torsion vibrator or a translatory vibrator.

10. The micromechanical device according to claim 1, wherein the adjuster for adjusting the resonant frequency is adapted to adjust the position of the at least two spring beams with respect each other in discrete steps and/or continuously.

11. The micromechanical device according to claim 1, wherein the oscillation body is a deflection mirror.

12. A light-deflecting apparatus, comprising:
a micromechanical device, comprising:
an oscillation system comprising an oscillation body;
an elastic suspension, by means of which the oscillation body is oscillatorily mounted to a support body, wherein the elastic suspension comprises at least two spring beams;
an adjuster for adjusting a resonant frequency of the oscillation system by changing a position of the at least two spring beams of the elastic suspension with respect to each other, wherein the adjuster is adapted to change a position of a support-body-sided end of at least one of the at least two spring beams so as to adjust the position of the spring beams with respect to each other,
wherein the oscillation body is a deflection mirror;
a drive for operating the oscillation system at the resonant frequency.

13. A method for operating a micromechanical device with an oscillation system comprising an oscillation body and an elastic suspension, by means of which the oscillation body is oscillatorily mounted to a support body, wherein the elastic suspension comprises at least two spring beams, the method comprising:
adjusting a resonant frequency of the oscillation system by changing a position of the at least two spring beams of the elastic suspension with respect each other,
wherein the step of adjusting comprises changing a position of a support-body-sided end of at least one of the at least two spring beams so as to adjust the position of the spring beams with respect to each other.

14. The method for operating a micromechanical device according to claim 13, wherein the step of adjusting comprises changing the position of the at least two spring beams with respect to each other either in discrete steps or continuously.

15. The method according to claim 13, further comprising changing the positions of the at least two spring beams so as to shift the resonant frequency in the direction of a nominal resonant frequency.

* * * * *